(12) United States Patent
Takai et al.

(10) Patent No.: US 6,935,867 B1
(45) Date of Patent: Aug. 30, 2005

(54) CONNECTION UNIT BETWEEN SUBSTRATED AND COMPONENT AND METHOD FOR FABRICATING CONNECTION UNIT

(75) Inventors: Daisuke Takai, San Jose, CA (US); Kaoru Soeta, Kanagawa-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/852,911

(22) Filed: May 24, 2004

(51) Int. Cl.⁷ .............................................. H01R 12/00
(52) U.S. Cl. .......................................... 439/66; 439/70
(58) Field of Search ............................. 439/55, 65–67, 439/70–71, 77, 284–295, 74–75

(56) References Cited

U.S. PATENT DOCUMENTS 5,299,939 A  *  4/1994  Walker et al. ................ 439/74
6,396,677 B1      5/2002  Chua et al.
6,814,623 B2 *  11/2004  Hashiba ....................... 439/660
6,828,668 B2 *  12/2004  Smith et al. ................. 257/696
6,830,460 B1 *  12/2004  Rathburn ..................... 439/66

FOREIGN PATENT DOCUMENTS

JP           11-46059       7/1997

* cited by examiner

Primary Examiner—Khiem Nguyen
(74) Attorney, Agent, or Firm—Brinks Hofer Gilson & Lione

(57) ABSTRACT

A compact, simple connection unit for mounting an electronic component to a substrate includes connectors having one or more arm portions. The connectors are provided with internal stress, which allows the arm portions to grip the electronic component so that the electronic component can be firmly fixed to the substrate.

11 Claims, 13 Drawing Sheets

CONNECTION UNIT BETWEEN SUBSTRATED AND COMPONENT AND METHOD FOR FABRICATING CONNECTION UNIT

BACKGROUND OF THE INVENTION

1. Field of the Invention

The present invention relates to connection units for mounting electronic components, such as ICs, or other micro-components to substrates. In particular, the present invention relates to a connection unit that is disposed between a component and a substrate and that has a simple, compact structure compared to conventional ones. The present invention further relates to a connection unit that allows an electronic component or other micro-components to be mounted on a substrate and allows the electronic component to be firmly fixed to the substrate after the electronic component is inspected for its electrical properties. Furthermore, the present invention relates to a method for fabricating such a connection unit.

2. Description of the Related Art

Japanese Unexamined Patent Application Publication No. 11-46059 discloses a structure for mounting an IC to a substrate. Generally, as disclosed in the above document, soldering balls provided on the bottom surface of the IC are heat-melted to fix the solder to wiring patterns provided on a substrate, whereby the IC can be electrically connected to the substrate. Alternatively, an IC socket is used to mount the IC to the substrate.

However, for a small-sized IC, the use of soldering balls, as in the above document, may lead to, for example, a short circuit between the soldering balls disposed below the IC. Furthermore, the soldering balls must be uniform in size so that the IC can be properly fixed to the substrate. However, since the soldering balls must be reduced in size in proportion to the size reduction of the IC, it is becoming more difficult to form soldering balls that are uniform in size.

With such a structure for mounting an IC to a substrate using soldering balls, the inspection for the electrical properties of the IC is generally performed after the soldering balls are heat-melted for fixing the balls to the substrate.

If the IC is determined defective in the inspection process, it is extremely difficult to remove the IC since the IC is already fixed to the substrate. This is time-consuming and thus may lower the productivity rate.

On the other hand, in a case where an IC socket is used, the IC is disposed in the IC socket and can readily be dismounted from the IC socket. For this reason, even if it is determined that the IC is defective in the inspection process, the replacement of the IC is relatively easier compared to the case where the soldering balls are used.

However, as shown in FIG. 7 of the above document, for example, an IC socket is an extremely large component that occupies a large portion of the substrate, and therefore, does not comply with the demand for size reduction.

Furthermore, if there is a significant difference in thermal expansion coefficients between the substrate and the IC, a heat treatment during the fabrication process, for example, can cause a large distortion between the substrate and the IC. This may be problematic in that the IC cannot be properly and firmly mounted on the substrate.

SUMMARY OF THE INVENTION

Accordingly, it is an object of the present invention to provide a connection unit that is disposed between a component and a substrate and that has a simple, compact structure compared to conventional ones. Moreover, it is another object of the present invention that the connection unit allows an electronic component or other micro-components to be mounted on the substrate and allows the electronic component to be firmly fixed to the substrate after the electronic component is inspected for its electrical properties. Furthermore, it is another object of the present invention to provide a method for fabricating such a connection unit.

A connection unit for mounting a component to a substrate according to the present invention includes a connector disposed between the component and the substrate and having a first end and a second end. The connector has a mounting portion mounted on the substrate and has an arm portion at a side adjacent to the first end of the connector. The arm portion is adjacent to the mounting portion and extends towards the component from the mounting portion. The arm portion urges against the component by internal stress of the arm portion. The arm portion is connected to a predetermined position of the component and functions as a support between the component and the substrate.

Accordingly, the present invention provides a new type of a connection unit in place of conventional ones that include, for example, soldering balls or IC sockets. The internal stress contained in the connector allows the arm portion to be connected to a predetermined position of the component so that the arm portion functions as a support between the component and the substrate.

Instead of using, for example, a bonding material such as solder, or IC sockets, the present invention utilizes the resilient force of the connector applied against the component to hold the component and the substrate together. Thus, with respect to small-sized components, the connection unit can relatively be reduced in size. Moreover, the size-reduced connection unit can effectively function as a support between the component and the substrate so that the component can be firmly fixed to the substrate.

Furthermore, according to the present invention, for example, even if there is a significant difference in thermal expansion coefficients between the substrate and the component, since the arm portion is resilient and can thus compensate for the distortion caused by the different thermal expansion coefficients, the component can be firmly fixed to the substrate.

Furthermore, at least two of the connectors are preferably provided in the present invention so that the component can be gripped between the arm portions of the connectors. The gripping force of the connectors allows the component to be fixed to the substrate in a more stable manner.

According to the present invention, the component is preferably an electronic component and each connector is preferably electrically conductive. Moreover, it is preferable that the electronic component is electrically connected to wiring provided in the substrate via the connectors. According to the present invention, the connection unit can be reduced in size while effectively maintaining the electrical connectability between the component and the substrate.

Furthermore, according to the present invention, the electronic component preferably includes a terminal extending towards the substrate from the bottom surface of the electronic component, and each arm portion is connected to a predetermined position of the terminal. In this case, a single terminal or a plurality of terminals may be provided. It is preferable that each terminal is gripped between two arm portions from opposite directions.

Consequently, the connection unit can be further reduced in size while ensuring the electrical connectability between the substrate and the electronic component.

Furthermore, according to the present invention, each connector is preferably provided with a holding portion at a side adjacent to the second end of the connector, the second end being opposite to the first end of the connector. The internal force of the holding portion forces the tip of the holding portion to bend upward toward the bottom surface of the component. The component is preferably disposed on the tip of the holding portion such that the tip functions as a contact. Even if there is a significant difference in thermal expansion coefficients between the substrate and the component, since the holding portion is resilient and can thus compensate for the distortion caused by the different thermal expansion coefficients, the component can be properly fixed to the substrate.

Furthermore, according to the present invention, each arm portion preferably extends from the mounting portion and curves outward toward a predetermined position of the component. As mentioned above, the internal stress causes the arm portion to curl upward. By controlling the internal stress such that the arm portion forms a curve, the arm portion can urge against the predetermined position of the component. Thus, a strong force is applied against the component from each of the arm portions so that the component can be firmly gripped between the arm portions.

Furthermore, according to the present invention, each of the connectors is preferably formed by thin-film deposition. This contributes to size reduction of the connection unit.

Furthermore, according to the present invention, a method for fabricating the connection unit is provided. The method includes:

a first step for forming a dummy layer on the substrate and then forming a connector on the dummy layer such that lower surface and the upper surface of the connector is provided with different types of internal stress;

a second step for patterning the connector into a predetermined shape so that the patterned connector is provided with a mounting portion for mounting the connector to the substrate, an arm portion extending from a first side of the mounting portion, and a holding portion extending from a second side of the mounting portion;

a third step for forming a deformation-restraining layer on the connector, the deformation-restraining layer not being formed on the holding portion and over a part of the arm portion;

a fourth step for removing at least a segment of the dummy layer disposed below the arm portion;

a fifth step for disposing the component on the holding portion of the connector; and a sixth step for removing the deformation-restraining layer so that the internal stress of the arm portion of the connector forces the arm portion to bend upward. In the sixth step, the arm portion is connected to a predetermined position of the component to function as a support between the component and the substrate.

The present invention is characterized in that: different types of internal stress are added to the lower surface of connector and the upper surface of the connector in the first step; the deformation-restraining layer is formed on the connector in the third step; the dummy layer below the arm portion of the connector is removed in the fourth step; and the deformation-restraining layer is removed and the internal stress forces the arm portion of the connector to curl upward in the sixth step so that the arm portion connects with a predetermined position of the component.

According to the fabrication method described above, the connection between the electronic component and the arm portion of the connector allows the electronic component to be properly fixed to the substrate, thus achieving a compact connection unit.

According to the present invention, it is preferable that the lower surface of the connector is provided with tensile stress and the upper surface is provided with compressive stress. Consequently, this induces elastic deformation of the arm portion after the removal of the deformation-restraining layer in the sixth step, such that the arm portion curls upward and forms a curve.

Furthermore, the connector is preferably formed by the sputter deposition technique. It is preferable to control the internal stress for the connector during the sputter deposition process by changing the vacuum gas pressure. This achieves a simple process for controlling the internal stress for the connector.

Furthermore, according to the present invention, at least two of connectors are preferably formed between the substrate and the component in the sixth step so that the arm portions of the connectors grip the component.

Furthermore, according to the present invention, the component is preferably an electronic component and each connector is preferably formed of a conductive material. Moreover, it is preferable that the electronic component is electrically connected to wiring provided in the substrate via the connectors.

Furthermore, according to the present invention, the fifth step preferably includes an inspection substep for inspecting the electronic component for its electrical properties after the electronic component is disposed on the connectors. The inspection substep is performed for determining whether the electronic component is defective or non-defective. The fabrication process may move on to the sixth step if the electronic component is determined non-defective. On the other hand, if the electronic component is determined defective, the defective electronic component may be replaced with a new one and the inspection substep may be repeated for the new electronic component.

The inspection process for the electrical properties of electronic components in the present invention is a distinctive feature of the present invention. Specifically, before the electronic component is fixed to the substrate in the sixth step, the inspection is performed in a state in which the electronic component is merely disposed on the connector. For this reason, even if it is determined that the electronic component is defective, the defective electronic component can easily be replaced with a new one.

Accordingly, this achieves an easier inspection process for the electrical properties of the electronic component, thus improving the productivity rate.

Furthermore, according to the present invention, the second step preferably includes a substep for forming a plurality of holes in the arm portion of each connector. In this case, in the third step, the deformation-restraining layer is not formed over a part of the arm portion provided with the holes, and in the fourth step, the segment of the dummy layer below the arm portion may be removed by using the holes.

Accordingly, this ensures the removal of the dummy layer below the arm portion. Thus, when the deformation-restraining layer is removed in the sixth step, each arm portion can be elastically deformed in a proper manner.

Furthermore, according to the present invention, the dummy layer below the holding portion of each connector is preferably removed in the fourth step. Thus, the internal stress causes the holding portion to curl upward. Moreover, the component is preferably disposed on the tip of the holding portion in the fifth step such that the tip functions as a contact.

Furthermore, according to the present invention, it is preferable to perform a heat treatment in the sixth step to add thermal stress to each connector. This induces elastic deformation of the arm portion to a great extent so that the arm portion can urge against the component with a greater force. Consequently, the component can be firmly fixed to the substrate in a more stable manner.

DESCRIPTION OF THE PREFERRED EMBODIMENTS

Figure 1:
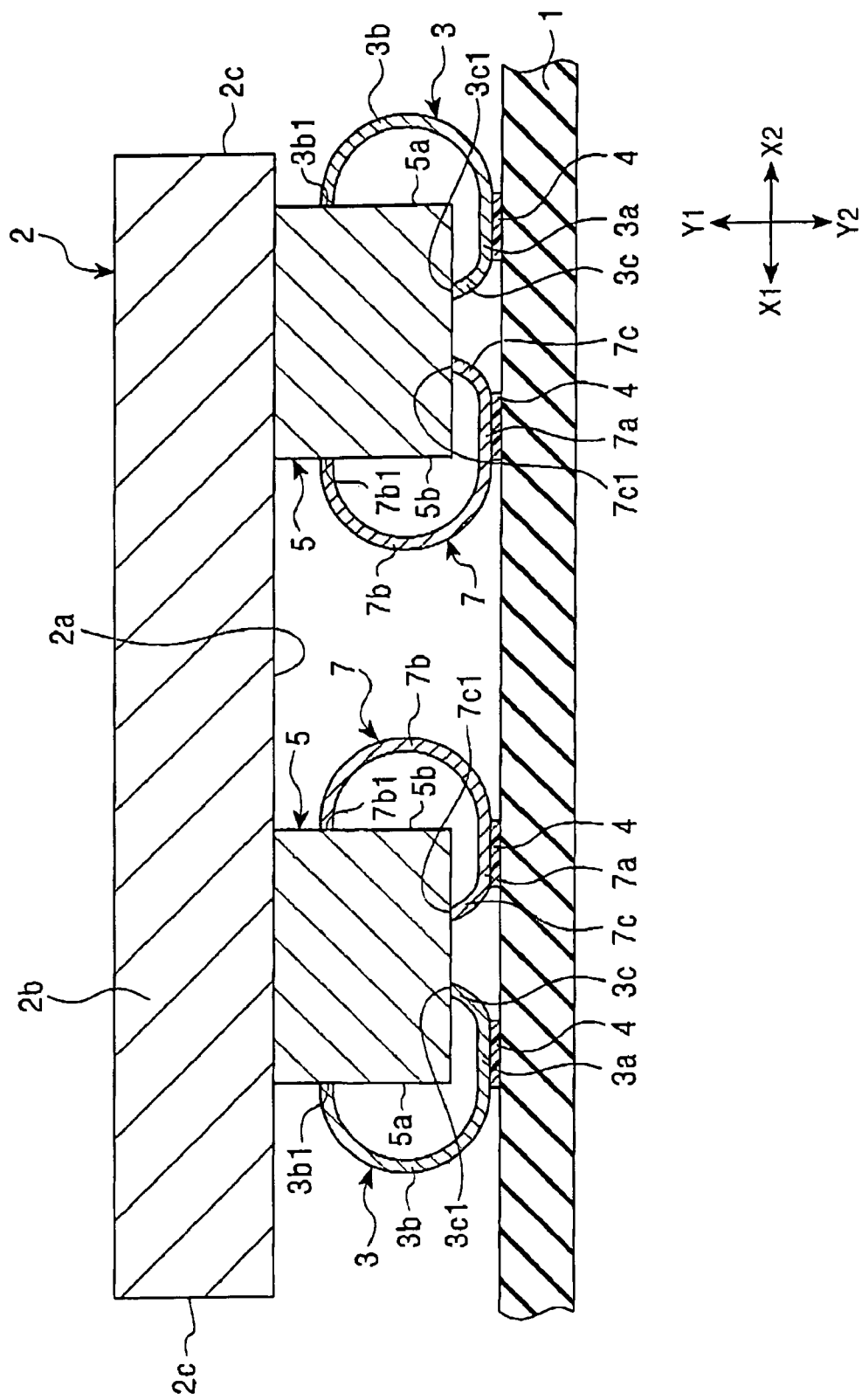
FIG. 1 is a partial cross-sectional view of a substrate, an electronic component, and connectors according to a first embodiment of the present invention.
Figure 2:
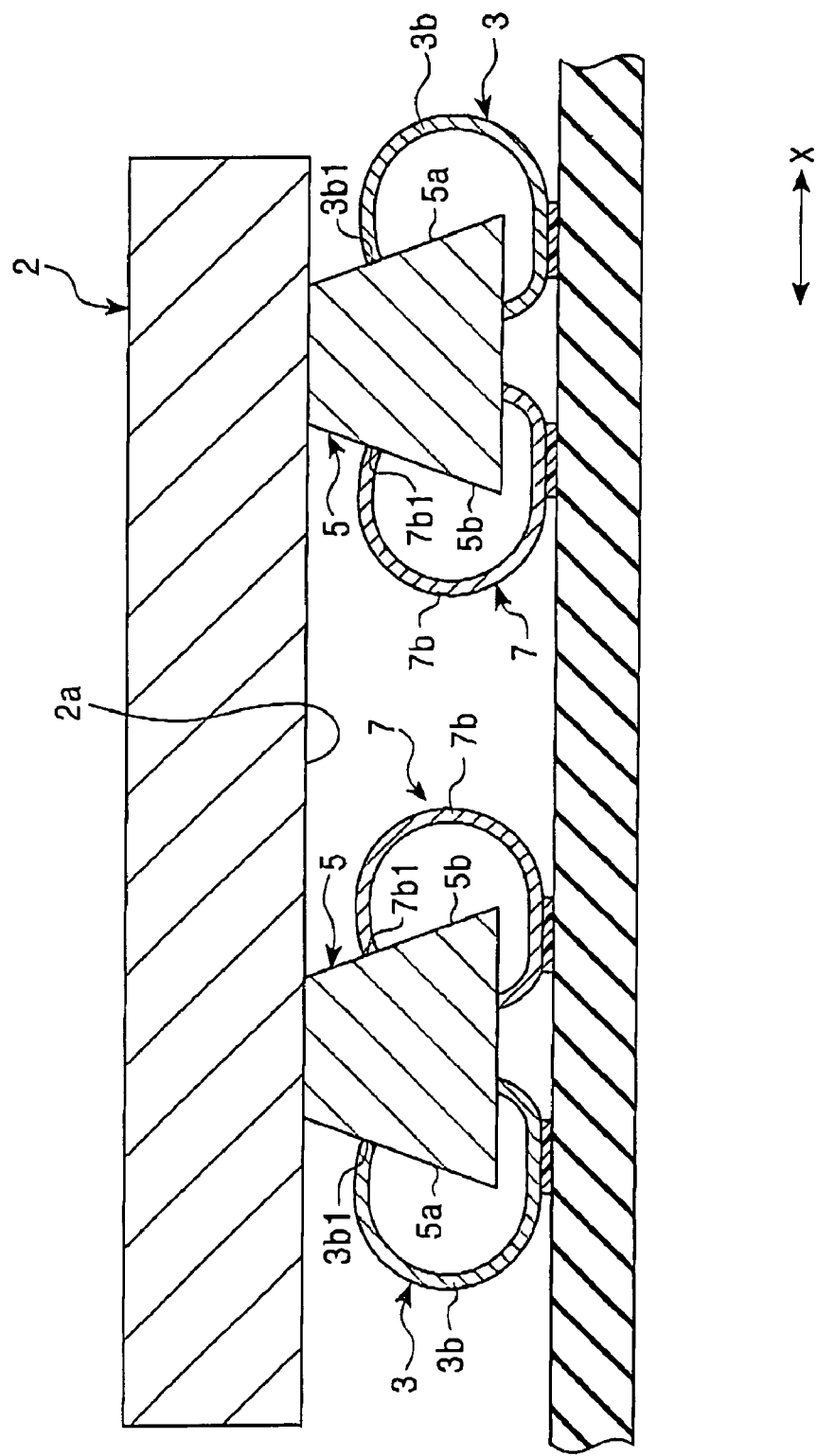
FIG. 2 is a partial cross-sectional view of the substrate, the electronic component, and the connectors according to a second embodiment of the present invention.
Figure 3:
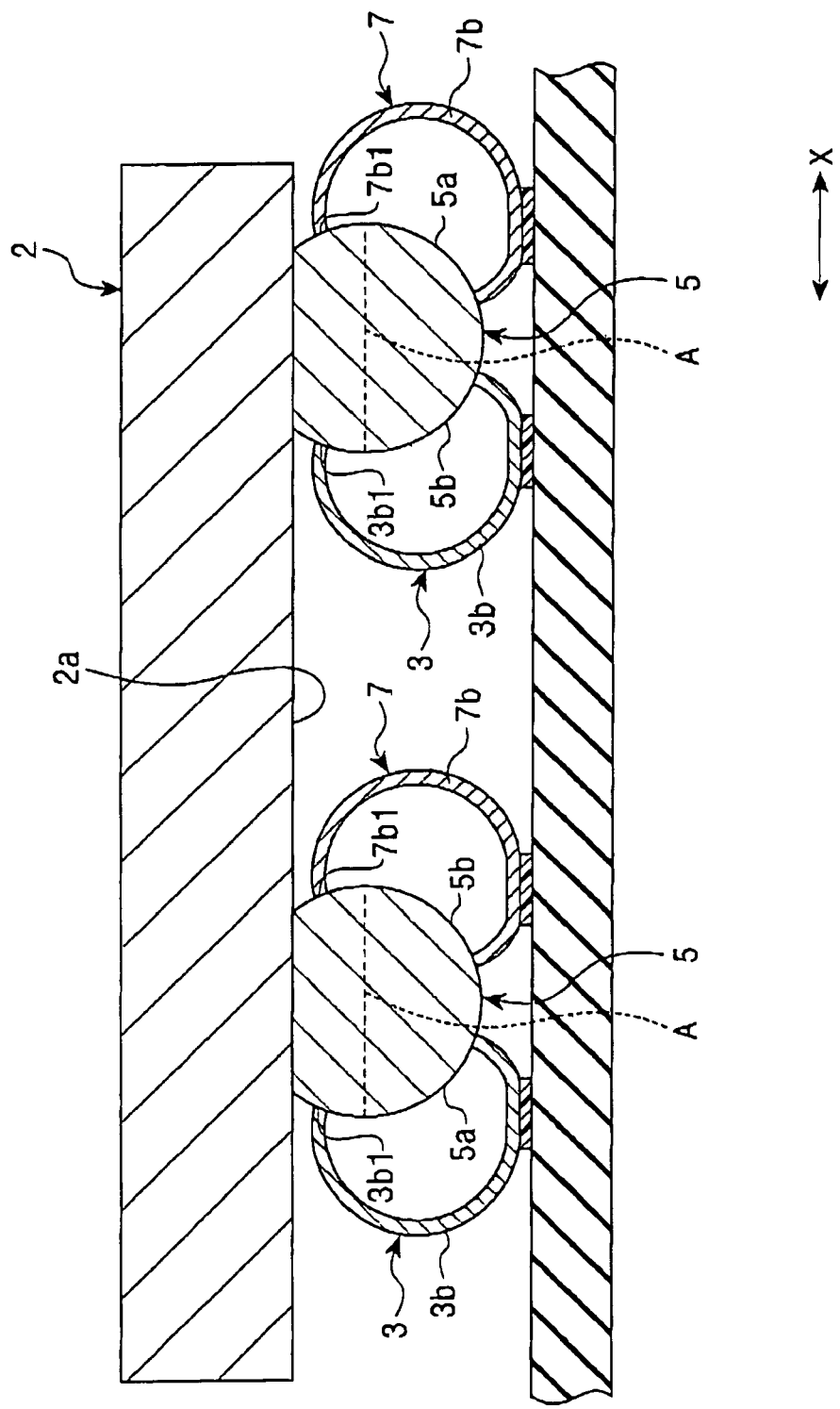
FIG. 3 is a partial cross-sectional view of the substrate, the electronic component, and the connectors according to a third embodiment of the present invention.
Figure 4:
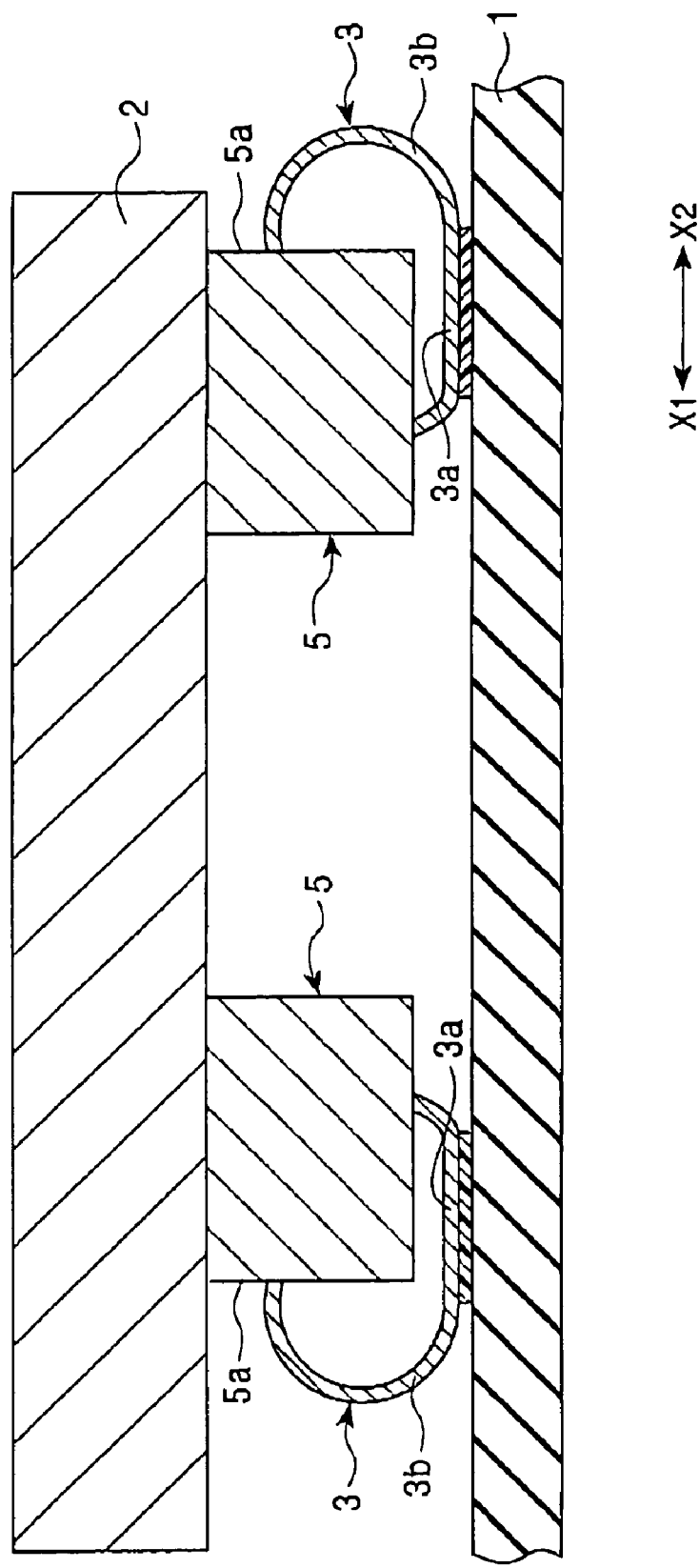
FIG. 4 is a partial cross-sectional view of the substrate, the electronic component, and the connectors according to a fourth embodiment of the present invention.
Figure 5:
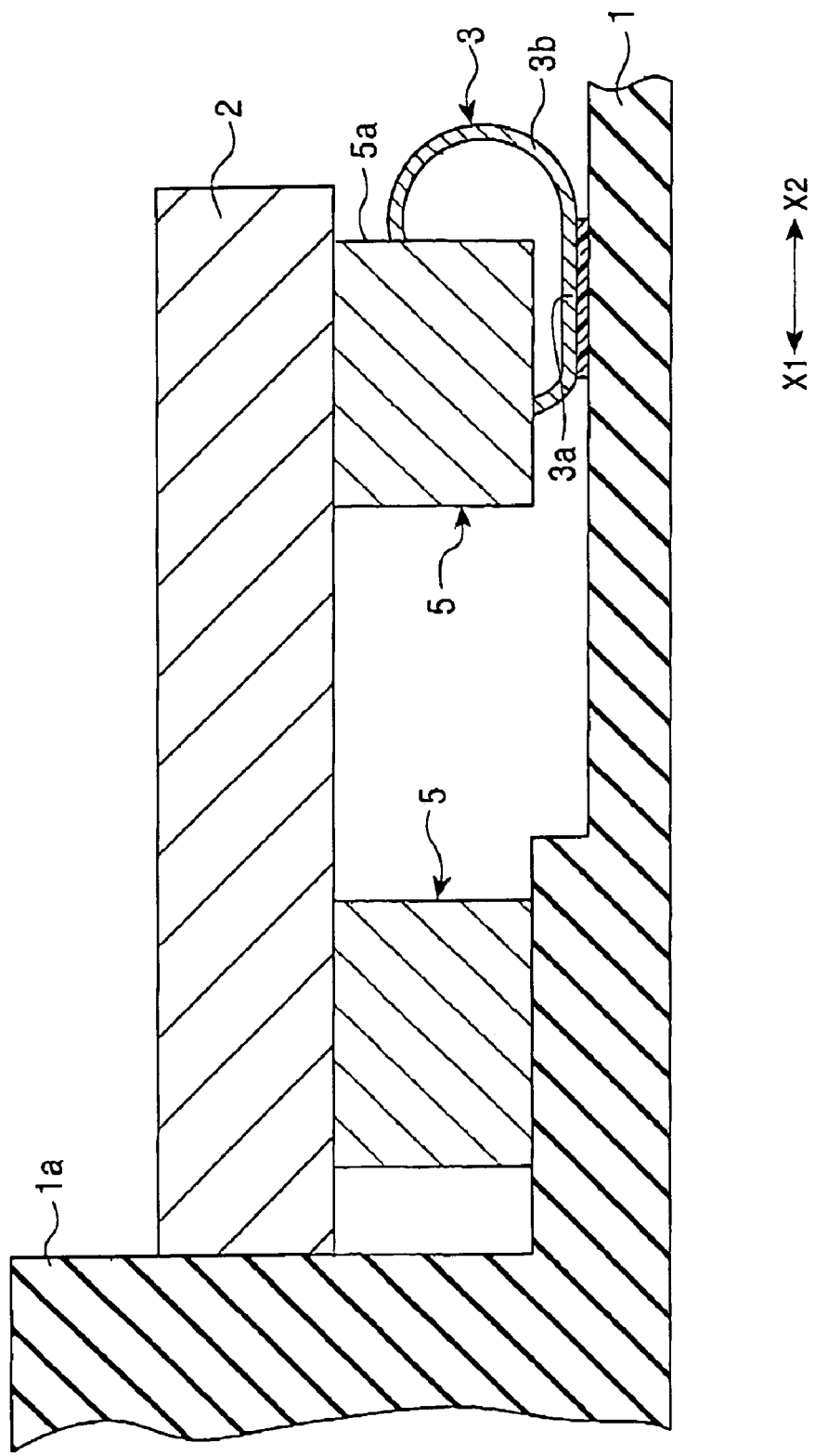
FIG. 5 is a partial cross-sectional view of the substrate, the electronic component, and one connector according to a fifth embodiment of the present invention.
Figure 6:
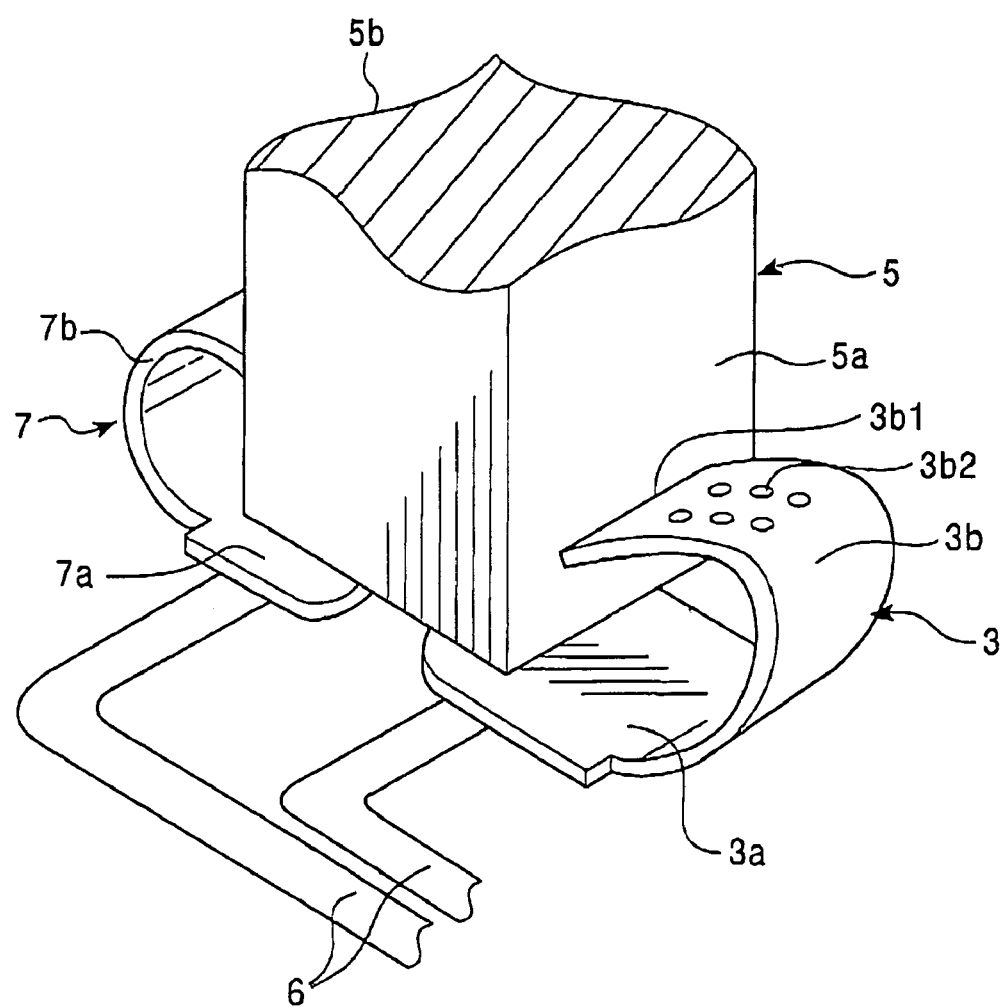
FIG. 6 is a partially-enlarged perspective view mainly illustrating two of the connectors that are disposed below one of terminals shown in the right half section of FIG. 1.

FIGS. 1 to 3 are partial cross-sectional views, which mainly illustrate an insulative substrate 1, an electronic component 2, and conductive connectors 3 and 7 according to embodiments of the present invention. FIGS. 4 and 5 are also partial cross-sectional views, which mainly illustrate the insulative substrate 1, the electronic component 2, and at least one of the connectors 3 according to embodiments of the present invention. FIG. 6 is a partially-enlarged perspective view mainly illustrating the connectors 3 and 7 disposed below one of terminals 5 shown in the right half section of FIG. 1.

FIGS. 1 and 6 illustrate a first embodiment according to the present invention. The electronic component 2 is disposed above the substrate 1 and may be, for example, an IC, a capacitor, or a transistor.

Referring to FIG. 1, the electronic component 2 includes a main body 2b and the terminals 5 protruding toward the substrate 1 from an undersurface 2a of the electronic component 2.

According to the first embodiment, the cross section of each terminal 5 is either square or rectangular.

Referring to FIG. 6, each terminal 5 is electrically connected to a wiring pattern 6, which is disposed on the substrate 1, via the connectors 3 and 7. Although the wiring pattern 6 is disposed on the substrate 1 in FIG. 6, an alternative structure is also possible. For example, through holes may extend from the top surface to the bottom surface of the substrate 1 such that the wiring pattern 6 may be disposed on the inner side surfaces of the through holes.

As shown in FIG. 1, two sets of the conductive connectors 3 and 7 are mounted on the substrate 1 to support the electronic component 2.

Referring to FIG. 1, each set of the connectors 3 and 7 has respective mounting portions 3a and 7a each of which is fixed to the substrate 1 via a dummy layer 4. The dummy layer 4 may be electrically conductive or insulative. For example, the dummy layer 4 may be composed of resin containing a mixture of, for example, Ti and conductive fillers.

Each set of the connectors 3 and 7 has respective arm portions 3b and 7b extending toward a certain direction from the corresponding mounting portions 3a and 7a. In the first embodiment, two connectors 3 and 7 are used for mounting each terminal 5 above the substrate 1.

With respect to the terminal 5 in the right half section of FIG. 1, the arm portion 3b of the connector 3, which is disposed adjacent to an outer side surface 5a of the corresponding terminal 5, extends outward from the mounting portion 3a in the X2 direction shown in FIG. 1 and forms a curve as the arm portion 3b curls upward in the Y1 direction. A tip 3b1 of the arm portion 3b bends backward and is connected to the outer side surface 5a of the terminal 5. On the other hand, with respect to the other terminal 5 in the left half section of FIG. 1, the arm portion 3b extends outward from the mounting portion 3a in the X1 direction and forms a curve as the arm portion 3b curls upward in the Y1 direction. The tip 3b1 of the arm portion 3b bends backward and is connected to the outer side surface 5a of the terminal 5.

Similarly, with respect to the terminal 5 in the right half section of FIG. 1, the arm portion 7b of the connector 7, which is disposed adjacent to an inner side surface 5b of the terminal 5, extends from the mounting portion 7a in the X1 direction and forms a curve as the arm portion 7b curls upward in the Y1 direction. A tip 7b1 of the arm portion 7b bends backward and is connected to the inner side surface 5b of the terminal 5. On the other hand, with respect to the other terminal 5 in the left half section of FIG. 1, the arm portion 7b extends from the mounting portion 7a in the X2 direction and forms a curve as the arm portion 7b curls upward in the Y1 direction. The tip 7b1 of the arm portion 7b bends backward and is connected to the inner side surface 5b of the terminal 5.

The arm portions 3b and 7b of the connectors 3 and 7, respectively, contain internal stress which allows the arm portions 3b and 7b to be elastically deformed to a curved-shape shown in FIG. 1. As will be described later, the arm portions 3b and 7b are given different types of internal stress during the fabrication process of the connectors 3 and 7. In detail, the lower surfaces of the arm portions 3b and 7b, that is, the outer surfaces of the curved arm portions 3b and 7b in FIG. 1, are provided with tensile stress, whereas the upper surfaces of the arm portions 3b and 7b, that is, the inner surfaces of the curved arm portions 3b and 7b in FIG. 1, are provided with compressive stress. This induces elastic deformation of the arm portions 3b and 7b such that the arm portions 3b and 7b curl upward to form a curve and are connected to the respective outer side surfaces 5a and inner side surfaces 5b of the terminals 5.

As shown, the arm portions 3b and 7b resiliently urge against the corresponding terminal 5 toward the center of the terminal 5. To increase this resilient force of the arm portions 3b and 7b against the terminal 5, it is preferable to properly control the internal stress contained in the arm portions 3b and 7b and to allow the arm portions 3b and 7b to curl upward and form a curve, as shown in FIG. 1. Since the curved arm portions 3b and 7b each apply a strong resilient force against the corresponding terminal 5, the terminal 5 is firmly gripped between the arm portions 3b and 7b. In the first embodiment of FIG. 1, although the tips 3b1 and 7b1 of the arm portions 3b and 7b are respectively in contact with the outer side surface 5a and the inner side surface 5b of each terminal 5, the arm portions 3b and 7b may alternatively be curled even further than the state shown in FIG. 1 such that the outer surfaces of the arm portions 3b and 7b may respectively be in contact with the outer side surface 5a and the inner side surface 5b of the corresponding terminal 5. This structure is more preferable due to the fact that a greater resilient force is applied against the terminals 5, meaning that each terminal 5 can be firmly gripped between the arm portions 3b and 7b with a greater force.

Referring to FIG. 1, each set of the connectors 3 and 7 respectively has holding portions 3c and 7c which extend in the opposite direction from the arm portions 3b and 7b and support each terminal 5 of the electronic component 2. The holding portions 3c and 7c has respective contact tips 3c1 and 7c1 which bend upward by internal stress and contact the bottom surface of the corresponding terminal 5 of the electronic component 2. Thus, each terminal 5 is disposed on the corresponding set of contact tips 3c1 and 7c1.

Each terminal 5 is electrically connected to the substrate 1 via the contact tips 3c1 and 7c1. Accordingly, this ensures the electrical connection between the substrate 1 and the electronic component 2.

Furthermore, when disposing the electronic component 2 on the connectors 3 and 7, even if there are slight differences in height between the contact tips 3c1 and 7c1, each of the contact tips 3c1 and 7c1 can be properly connected to the bottom surface of the corresponding terminal 5 of the electronic component 2 since the holding portions 3c and 7c have resiliency and can thus be deformed.

FIGS. 2 and 3 respectively illustrate a second embodiment and a third embodiment according to the present invention. The second embodiment and the third embodiment are different from the first embodiment in that the cross section of the terminals 5 is different to that of the terminals 5 in the first embodiment.

Referring to FIG. 2, the cross section of each terminal 5 in the second embodiment is substantially trapezoidal. Specifically, the width between the inner side surface 5b and the outer side surface 5a of each terminal 5 in the X direction in FIG. 2 gradually increases from the upper side of the terminal 5 to the lower side so as to form slopes. Similar to the first embodiment of FIG. 1, each set of tips 3b1 and 7b1 of the arm portions 3b and 7b of the connectors 3 and 7 is respectively connected to the outer side surface 5a and the inner side surface 5b of the corresponding terminal 5.

The embodiments shown prevent the connections between the terminals 5 and the connectors 3 and 7 from becoming loose due to, for example, vibration. This decreases deterioration of the electrical connectability, and moreover, dislocation of the terminals 5 from the connectors 3 and 7.

According to the present invention, instead of using adhesives or solder for fixing each terminal 5 to the connectors 3 and 7, the arm portions 3b and 7b of the connectors 3 and 7 resiliently urge against the terminal 5 so that the terminal 5 can be gripped between the connectors 3 and 7.

As described above, since the width between the inner side surface 5b and the outer side surface 5a of each terminal 5 gradually increases from the upper side of the terminal 5 to the lower side to form slopes, the terminal 5 is firmly gripped between the arm portions 3b and 7b and thus cannot be easily dislocated from the connectors 3 and 7 due to, for example, vibration. Specifically, even if the terminal 5 is pulled in the upward direction, it is highly unlikely that the terminal 5 may come off the arm portions 3b and 7b. Alternatively, the outer side surface 5a and the inner side surface 5b of each terminal 5 may be curved surfaces.

FIG. 3 illustrates the third embodiment of the present invention. The cross section of each terminal 5 in the third embodiment is substantially circular. Similar to the first embodiment of FIG. 1, each set of tips 3b1 and 7b1 of the arm portions 3b and 7b of the connectors 3 and 7 is respectively connected to the outer side surface 5a and the inner side surface 5b of the corresponding terminal 5, and the terminal 5 is gripped between the connectors 3 and 7.

Referring to FIG. 3, imaginary lines A are drawn across the width of the terminals 5 in the X direction and are positioned where the width of the terminals 5 are at maximum, i.e. the diameter of each terminal 5. With respect to a side of each terminal 5 above the imaginary line A, the width between the outer side surface 5a and the inner side surface 5b gradually increases from the top surface of the terminal 5 to the imaginary line A.

For this reason, it is preferable that the tips 3b1 and 7b1 of the arm portions 3b and 7b of the connectors 3 and 7 are respectively connected to the outer side surface 5a and the inner side surface 5b above the imaginary line A. Consequently, the terminal 5 can be firmly gripped between the arm portions 3b and 7b so that even if the terminal 5 is pulled in the upward direction, it is highly unlikely that the terminal 5 may come off the arm portions 3b and 7b.

The cross section of the terminals 5 is not limited to the shapes illustrated in FIGS. 1 to 3 according to the first to third embodiments, and may be other alternative shapes. For example, the outer side surface 5a and the inner side surface 5b of each terminal 5 may be inclined surfaces or curved surfaces in which the width between the outer side surface 5a and the inner side surface 5b may gradually decrease from the upper side of the terminal 5 to the lower side.

FIG. 4 illustrates a fourth embodiment according to the present invention. The fourth embodiment is different from the first embodiment in that only one connector 3 is provided for each terminal 5. With respect to the terminal 5 in the right half section of FIG. 4, the arm portion 3b of the connector 3 extends outward from the mounting portion 3a in the X2 direction and forms a curve as the arm portion 3b curls upward. The tip 3b1 of the arm portion 3b is connected to the outer side surface 5a of the terminal 5. On the other hand, with respect to the other terminal 5 in the left half section of FIG. 4, the arm portion 3b extends outward from the mounting portion 3a in the X1 direction and forms a curve as the arm portion 3b curls upward. The tip 3b1 of the arm portion 3b is connected to the outer side surface 5a of the terminal 5.

In the fourth embodiment of FIG. 4, the two terminals 5 are held by the arm portions 3b of the connectors 3 so that the electronic component 2 can be fixed to the substrate 1.

Although it is more preferable that each terminal 5 is gripped between the arm portions 3b and 7b of the connectors 3 and 7, as shown in FIGS. 1 to 3, so as to firmly fix the electronic component 2 to the substrate 1, the structure of the fourth embodiment shown in FIG. 4 is also included within the scope of the present invention since the electronic component 2 can be supported by the arm portions 3b of the connectors 3.

Furthermore, an alternative structure which only includes the two connectors 7 connected to the inner side surfaces 5b of the terminals 5 is also possible. In this case, the two terminals 5 are supported by the two respective connectors 7.

Furthermore, according to the first to fourth embodiments shown in FIGS. 1 to 4 and FIG. 6, although the arm portions 3b and 7b of the connectors 3 and 7 are connected to the corresponding outer side surfaces 5a and inner side surfaces 5b of the terminals 5 so that each terminal 5 is gripped between the corresponding arm portions 3b and 7b, an alternative structure is also possible in which the main body 2b of the electronic component 2 is gripped between the two arm portions 3b of the connectors 3.

FIG. 5 illustrates a fifth embodiment according to the present invention. According to the fifth embodiment, a portion of the electronic component 2 is directly fixed to the substrate 1. In FIG. 5, the substrate 1 is provided with a wall 1a, which may be a part of the substrate 1 or may be a separate component. A first end portion of the electronic component 2 is connected to the side surface of the wall 1a and a second end portion, that is, the outer side surface 5a of one of the terminals 5, has the arm portion 3b of the connector 3 connected thereto. The structure of the arm portion 3b of the connector 3 is the same as that of the first embodiment shown in FIGS. 1 and 6, and descriptions will thus be omitted. The arm portion 3b resiliently urges against the terminal 5 toward the center of the terminal 5, that is, toward the wall 1a, such that the first end portion of the electronic component 2 is pressed against the wall 1a. Accordingly, the electronic component 2 is fixed to the substrate 1.

In each of the embodiments shown in FIGS. 1 to 6, although each connector 3 (connector 7) is provided with one arm portion 3b (arm portion 7b), multiple arm portions may alternatively be provided for each connector 3 (connector 7).

Furthermore, each terminal 5 or the main body 2b may be gripped by the arm portions 3b and 7b of the connectors 3 and 7 from four directions.

Referring to FIG. 6, the arm portion 3b of each connector 3 is provided with a plurality of holes 3b2. As will be described later in the fabrication method, the holes 3b2 are used during the fabrication process of the connection unit. It is desirable to control the size and the number of the holes 3b2 for the reason that if there are too many holes 3b2 provided in the arm portion 3b or if the size of each hole 3b2 is too large, the strength of the arm portion 3b may weaken, and the arm portion 3b may lose the ability to grip the terminal 5 firmly. The arm portion 7b of each connector 7 is similarly provided with a plurality of holes.

It is preferable that the connectors 3 and 7 are formed by a thin film deposition technique, such as a sputter deposition technique, an electron-beam deposition technique, a molecular-beam epitaxial deposition technique, or a chemical vapor deposition technique. By applying a thin film deposition technique for forming the connectors 3 and 7, the size and the thickness of the connectors 3 and 7 can be reduced, thus contributing to reduction in size of the connection unit between the substrate 1 and the electronic component 2.

The connectors 3 and 7 are most preferably formed by the sputter deposition technique. As will be described later in the fabrication method, it is necessary to control the film forming conditions of the connectors 3 and 7 so that different types of internal stress are added to the lower surfaces and the upper surfaces of the connectors 3 and 7. With the sputter deposition technique, the internal stress for the connectors 3 and 7 can be changed easily by adjusting the vacuum gas pressure.

The connectors 3 and 7 are formed of a conductive material, such as a NiZr alloy, for maintaining the electrical connectability between the electronic component 2 and the substrate 1.

Alternatively, the connectors 3 and 7 may be formed of flexible flat plates. In that case, each flat plate may be preliminarily bent to form a curve, like the arm portions 3b and 7b in FIG. 1, so that the flat plate can have resiliency. The connectors 3 and 7 may be formed into a predetermined shape by, for example, pressing the flat plate or performing electron-beam exposure on the flat plate.

Furthermore, the connectors 3 and 7 may be coated with a Ni film or a precious metal film having high conductive properties, such as Au, to improve the electrical connectability between each terminal 5 of the electronic component 2 and the connectors 3 and 7, and also to prevent the conductivity from deteriorating due to, for example, rust.

As described above, the present invention provides a new type of a connection unit in place of conventional ones that include, for example, soldering balls or IC sockets. According to the present invention, the connectors 3 and 7 are provided with internal stress. Based on the internal stress, the arm portions 3b and 7b grip each terminal 5 so that the electronic component 2 can be fixed to the substrate 1.

Accordingly, instead of using, for example, a bonding material such as solder, or IC sockets, the present invention utilizes the supporting force of the connectors 3 and 7 to grip each terminal 5 of the electronic component 2. Thus, with respect to a small-sized electronic component 2, the connection unit between the substrate 1 and the electronic component 2 can be relatively reduced in size. Moreover, the size-reduced connection unit can effectively maintain the electrical connectability while firmly fixing the electronic component 2 to the substrate 1.

Furthermore, according to the present invention, even if there is a significant difference in thermal expansion coefficients between the substrate 1 and the electronic component 2, the resilient arm portions, for example, can compensate for the distortion caused by the different thermal expansion coefficients, thus maintaining the electronic component 2 firmly fixed to the substrate 1.

Since a bonding material, such as solder, is not required in the present invention, the connection unit of the present invention is advantageous for being environmentally resistant. On the other hand, if the gripping force of the connectors 3 and 7 of the connection unit is weak, an adhesive, for example, may be used to bond the electronic component 2 and the substrate 1 together. In that case, even if there is a significant difference in thermal expansion coefficients between the substrate 1 and the electronic component 2, the resilient arm portions 3b and 7b, for example, can compensate for the distortion caused by the different thermal expansion coefficients.

Furthermore, as shown in FIG. 5, each terminal 5 of the electronic component 2 does not necessarily have to be gripped between the corresponding connectors 3 and 7. Specifically, the arm portion 3b of a single connector 3 may be connected to a predetermined position of the electronic component 2 such that the arm portion 3b resiliently urges against the electronic component 2. Consequently, the electronic component 2 can be firmly fixed to the substrate 1.

Although the connection unit for connecting the electronic component 2 to the substrate 1 is described above, the present invention can also be applied to connection units for connecting other components, such as micro-components, to the substrate 1.

Figure 9A:
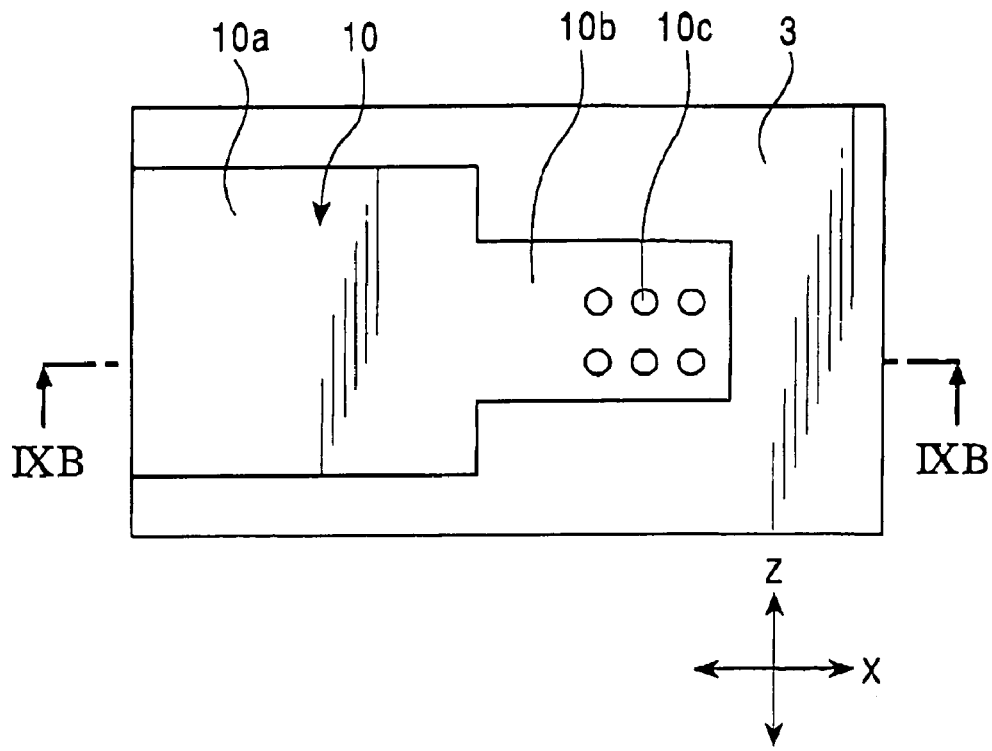
FIG. 9A illustrates one of the steps following the step shown in FIG. 8.
Figure 9B:
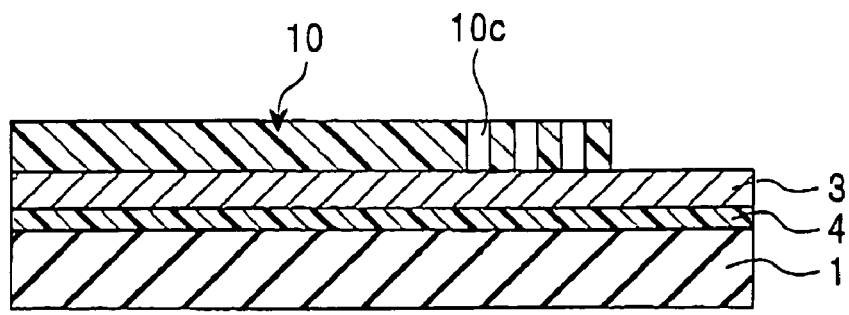
FIG. 9B is a cross-sectional view taken along line IXB—IXB shown in FIG. 9A.
Figure 10A:
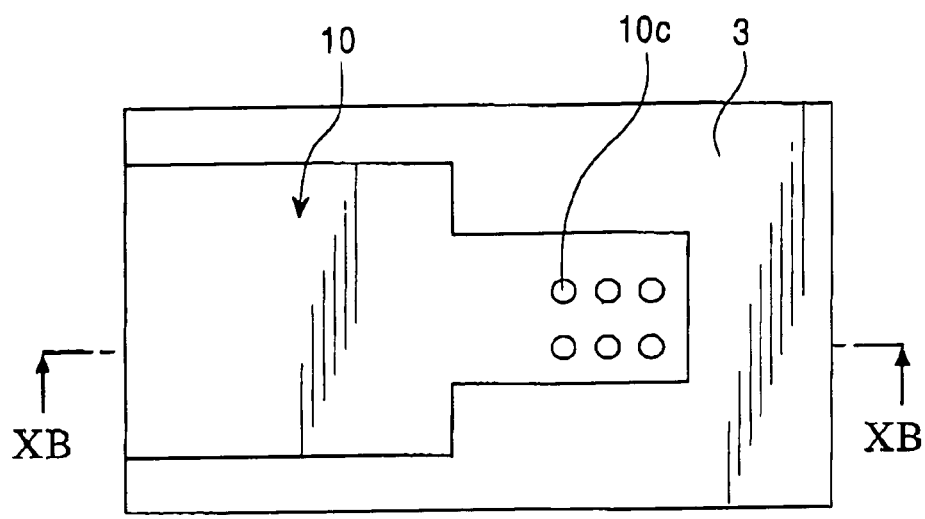
FIG. 10A illustrates one of the steps following the step shown in FIGS. 9A and 9B.
Figure 10B:
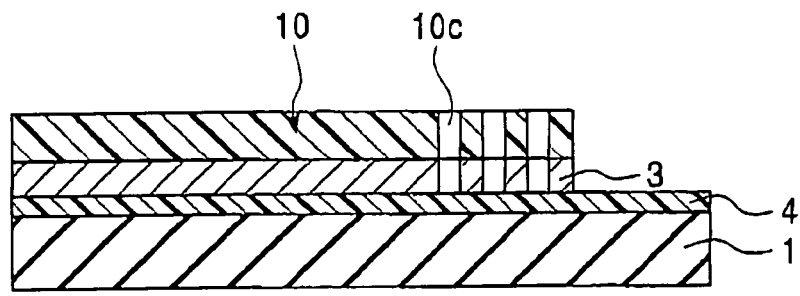
FIG. 10B is a cross-sectional view taken along line XB—XB shown in FIG. 10A.

A method for fabricating the connection unit between the substrate 1 and the electronic component 2 according to the present invention will now be described with reference to FIGS. 7 to 16. FIGS. 9A, 10A, and 12A are plan views each illustrating one of the process steps for the fabrication. FIG. 9B is a partial cross-sectional view taken along a dashed line IXB—IXB in FIG. 9A viewed from a side adjacent to arrows shown in FIG. 9A. Similarly, FIG. 10B is a partial cross-sectional view taken along a dashed line XB—XB in FIG. 10A viewed from a side adjacent to arrows shown in FIG. 10A. FIG. 12B is a partial cross-sectional view taken along a dashed line XIIB—XIIB in FIG. 12A viewed from a side adjacent to arrows shown in FIG. 12A.

FIGS. 7 to 14 only illustrate the fabrication process of, for example, the rightmost connector 3 shown in FIG. 1 to provide an easier explanation. Although not shown in the drawings, the remaining three connectors 3 and 7 shown in FIG. 1 are similarly fabricated in their predetermined positions on the substrate 1 simultaneously with the fabrication of the connector 3 shown in FIGS. 7 to 14.

Figure 7:
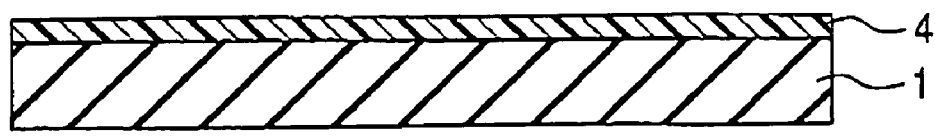
FIG. 7 illustrates one of steps included in a fabrication method for the connectors.

Referring to FIG. 7, the dummy layer 4 is formed over the substrate 1. The dummy layer 4 may be composed of a conductive material or an insulative material. For example, the dummy layer 4 may be composed of resin containing a mixture of, for example, Ti and conductive fillers.

Figure 8:
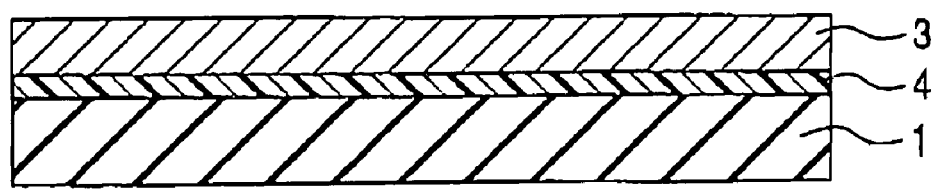
FIG. 8 illustrates one of the steps following the step shown in FIG. 7.

FIG. 8 illustrates a step for forming the connector 3 over the dummy layer 4 by, for example, a sputter deposition technique. The connector 3 is composed of a conductive material, such as MoCr or a NiZr alloy containing 1 atomic percent of Ni.

During the formation of the connector 3 using the sputter deposition technique, the vacuum gas pressure is changed gradually while the connector 3 is formed. Here, an Ar gas, for example, is used. As a result, the lower surface of the connector 3 is provided with tensile stress and the upper surface is provided with compressive stress.

FIGS. 9A and 9B illustrate a step for forming a resist layer 10 on the connector 3. Referring to FIG. 9A, the resist layer 10 is formed to a certain pattern by an exposure effect.

As shown in FIG. 9A, the resist layer 10 has a wide segment 10a, which is wide in the longitudinal direction of the drawing, i.e. the z-axis direction; and a narrow segment 10b, which extends from one of the sides of the wide segment 10a. The pattern of the resist layer 10 is not limited to the one shown in FIG. 9A.

The narrow segment 10b is provided with a plurality of holes 10c. It is preferable that the plurality of holes 10c are aligned in the longitudinal direction of the narrow segment 10b, i.e. the x-axis direction in FIG. 9A.

FIGS. 10A and 10B illustrate a step for removing a segment of the connector 3 not covered with the resist layer 10 by using an etching technique, such as ion milling, reactive ion etching, or plasma etching.

As shown in FIG. 10A, after this removing step, the connector 3 and the resist layer 10 have the same pattern.

Figure 11:
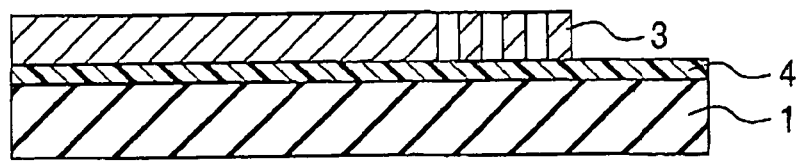
FIG. 11 illustrates one of the steps following the step shown in FIGS. 10A and 10B.
Figure 12A:
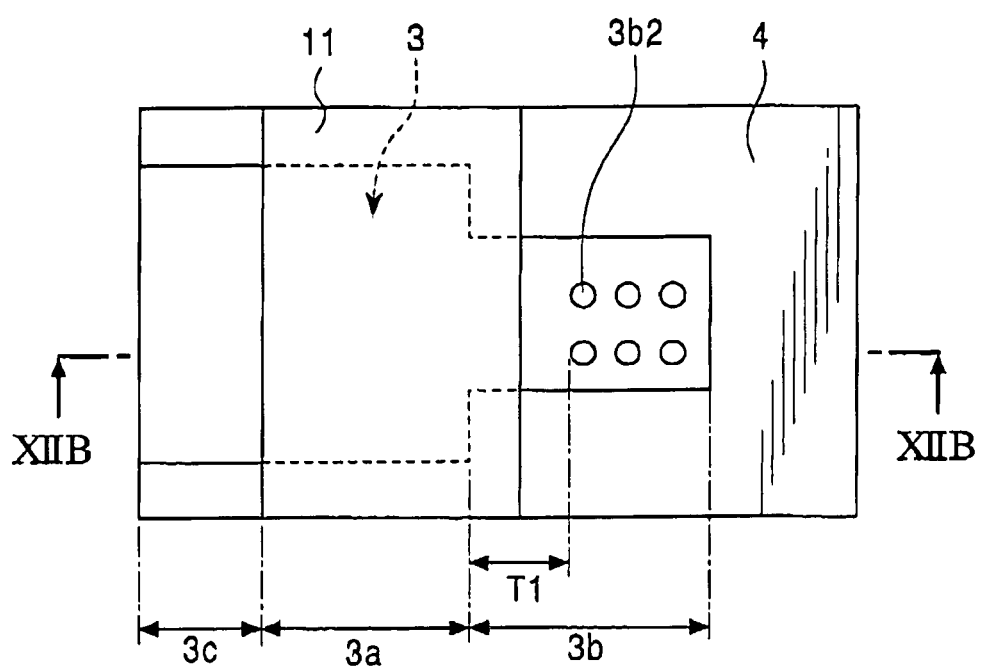
FIG. 12A illustrates one of the steps following the step shown in FIG. 11.
Figure 12B:
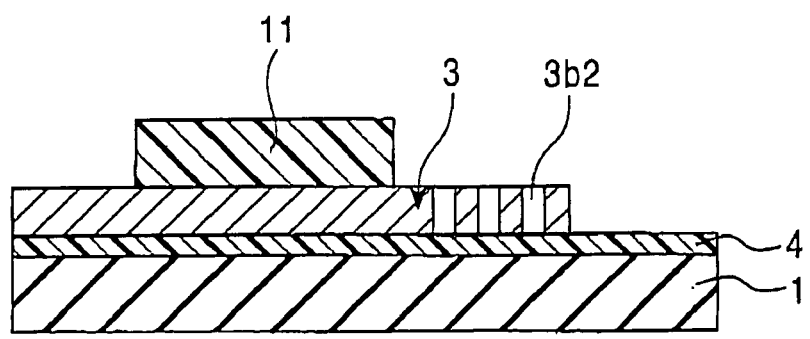
FIG. 12B is a cross-sectional view taken along line XIIB—XIIB shown in FIG. 12A.

FIG. 11 illustrates a step for removing the resist layer 10 by soaking the resist layer 10 with a solution.

FIGS. 12A and 12B illustrate a step for forming a deformation-restraining layer 11 in a predetermined position of the connector 3. The deformation-restraining layer 11 is, for example, a resist layer pattern-formed on the connector 3.

Referring to FIG. 12A, the connector 3 has the mounting portion 3a, the arm portion 3b protruding from a first side of the mounting portion 3a, and the holding portion 3c extending from a second side opposite to the first side.

The deformation-restraining layer 11 is formed over the entire mounting portion 3a and also over a part of the arm portion 3b. As shown in FIG. 12A, the deformation-restraining layer 11 is not formed on the holding portion 3c. Furthermore, the formation of the deformation-restraining layer 11 on the arm portion 3b is controlled so that the deformation-restraining layer 11 is prevented from covering over the holes 3b2 provided in the arm portion 3b.

Figure 13:
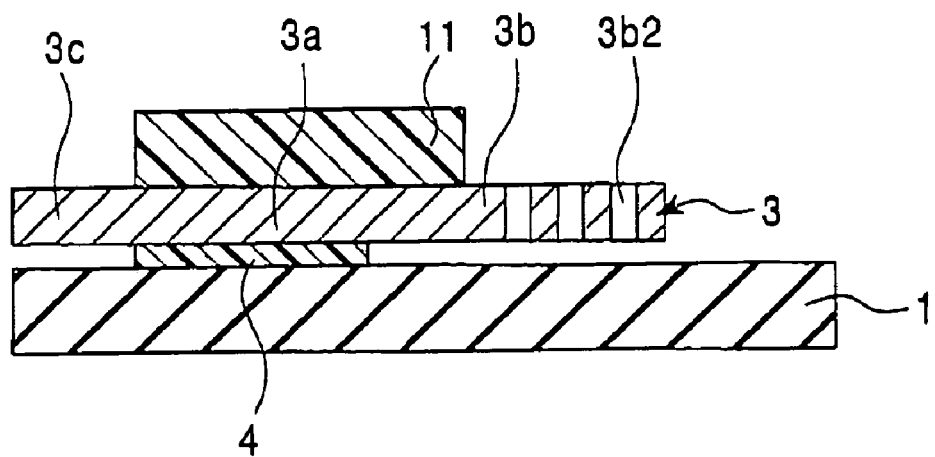
FIG. 13 illustrates one of the steps following the step shown in FIGS. 12A and 12B.

FIG. 13 illustrates a step for removing the dummy layer 4 below the arm portion 3b by, for example, a wet etching technique. In this removing step, the dummy layer 4 below the arm portion 3b is removed by using the holes 3b2 provided in the connector 3.

According to this the wet etching process, an etching solution reaches the dummy layer 4 below the arm portion 3b through the holes 3b2 and also flows around the sides of the arm portion 3b to dissolve the dummy layer 4 below the arm portion 3b. As shown in FIG. 12A, although there is a certain distance T1 between the mounting portion 3a and the holes 3b2 that are closest to the mounting portion 3a, since anisotropic wet etching is applied, the etching solution entering the holes 3b2 also flows toward the mounting portion 3a to dissolve the dummy layer 4 corresponding to the distance T1. Consequently, the dummy layer 4 below the arm portion 3b is effectively removed.

As illustrated in FIG. 12A, the deformation-restraining layer 11 extends over a part of the arm portion 3b of the connector 3. Accordingly, referring to FIG. 13, the lower surface of the arm portion 3b is completely free of an adjacent layer due to the removal of the dummy layer 4 below the arm portion 3b, whereas a part of the upper surface of the arm portion 3b is covered with the deformation-restraining layer 11, meaning that the upper surface is not completely free of an adjacent layer.

Furthermore, the etching solution also flows around the sides of the holding portion 3c to dissolve and remove the dummy layer 4 below the holding portion 3c of the connector 3. The holding portion 3c may also be provided with holes, like the arm portion 3b, so that the etching solution can reach the dummy layer 4 below the holding portion 3c through the holes to dissolve the dummy layer 4 below the holding portion 3c.

As shown in FIG. 13, the dummy layer 4 below the mounting portion 3a remains so that the mounting portion 3a can be fixed to the substrate 1.

When the predetermined segments of the dummy layer 4 are removed, the segments of the connectors 3, whose top and lower surfaces have no dummy layer 4 and deformation-restraining layer 11 adjacent thereto, are elastically deformed due to the internal stress. (See FIG. 14)

Figure 14:
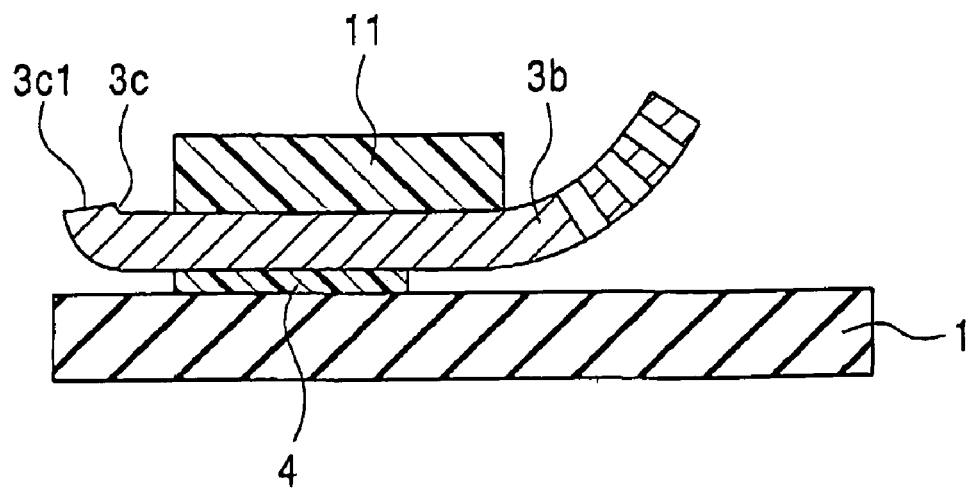
FIG. 14 illustrates one of the steps following the step shown in FIG. 13.

As described in the step of FIG. 8, the lower surface of the connector 3 is provided with tensile stress and the upper surface is provided with compressive stress. Referring to FIG. 14, this causes elastic deformation of the holding portion 3c and of a segment of the arm portion 3b having no adjacent restraining elements, causing the arm portions 3b and 7b to curl upward.

As illustrated in FIGS. 12A, 12B, and 13, since the deformation-restraining layer 11 is disposed over a part of the arm portion 3b, the arm portion 3b remains in a partially-restrained state.

Referring to FIG. 14, the contact tip 3c1 of the holding portion 3c curls upward due to the elastic deformation and acts as a contact between the electronic component 2 and the connector 3.

During the step illustrated in FIG. 14, segments of the connectors 3 and 7 that are not covered with the deformation-restraining layer 11 may be coated with a Ni film or a precious metal film having high conductive properties, such as Au, to improve the electrical connectability between each terminal 5 of the electronic component 2 and the connectors 3 and 7, and also to prevent the conductivity from deteriorating due to, for example, rust.

Figure 15:
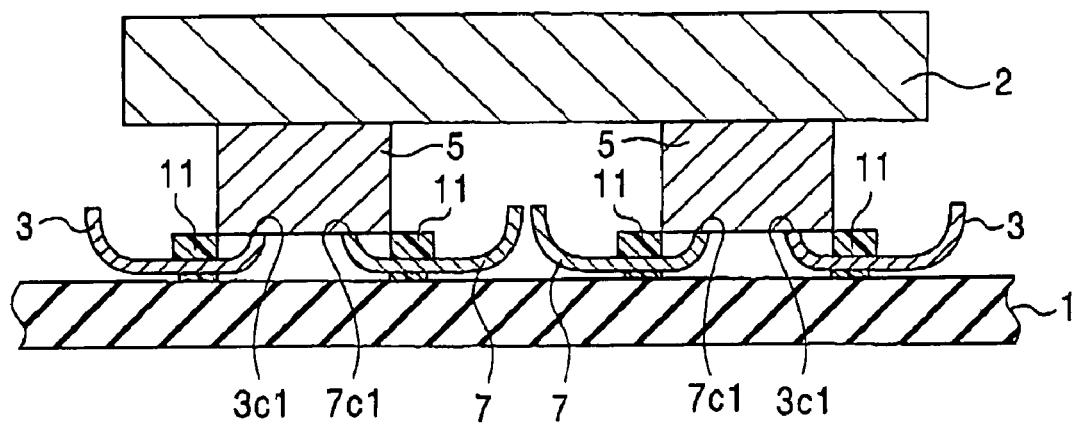
FIG. 15 illustrates one of the steps following the step shown in FIG. 14 and shows a state in which the electronic component is disposed on the connectors.

Referring to FIG. 15, two sets of the connectors 3 and the connectors 7 formed by the above method are disposed above the substrate 1 and face the corresponding terminals 5 extending from the bottom surface of the electronic component 2 towards the substrate 1.

The terminals 5 of the electronic component 2 are disposed on the contact tips 3c1 and 7c1 of the connectors 3 and 7 such that the bottom surface of each terminal 5 comes into contact with the corresponding contact tips 3c1 and 7c1. In this case, even if there are slight differences in height between the contact tips 3c1 and 7c1, each of the contact tips 3c1 and 7c1 can be properly connected to the bottom surface of the corresponding terminal 5 of the electronic component 2 since the holding portions 3c and 7c have resiliency and can thus be deformed.

In the present invention, the state illustrated in FIG. 15 is an unsupported state which implies that the arm portions 3b and 7b of the connectors 3 and 7 are not in a completely deformed state, and each of the terminals 5 is therefore not gripped between the corresponding arm portions 3b and 7b. In this unsupported state, inspections for the electrical properties of the electronic component 2 may be performed.

Figure 16:
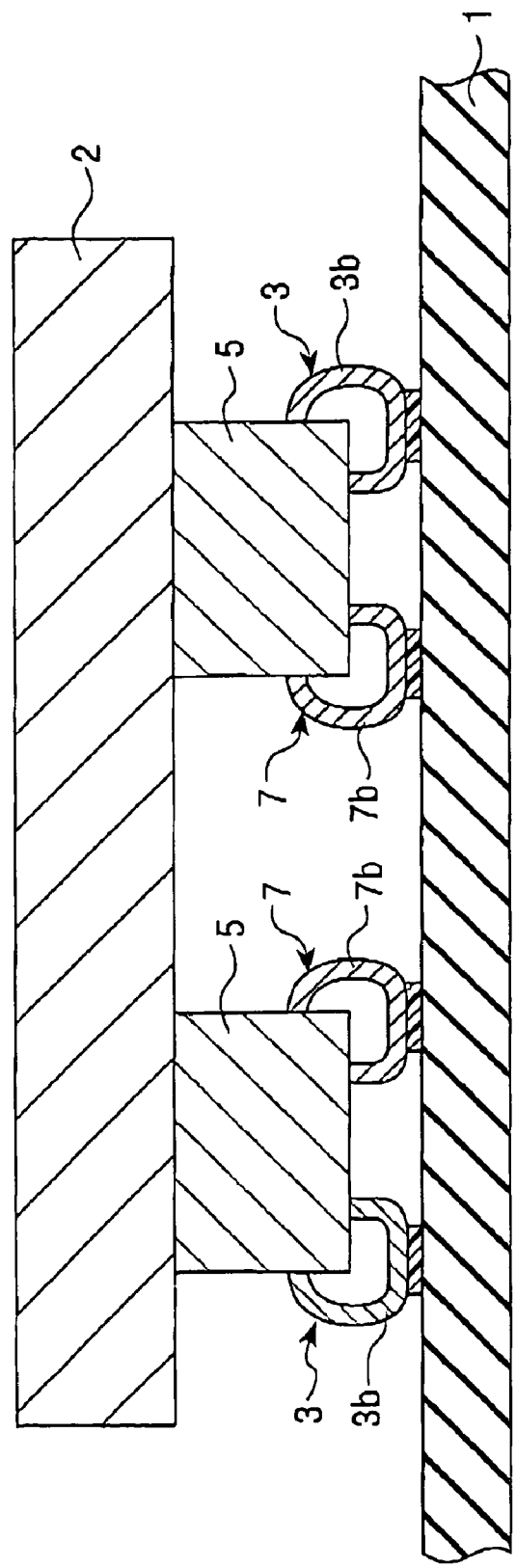
FIG. 16 illustrates one of the steps following the step shown in FIG. 15 and shows a state in which the electronic component is fixed to the substrate.

Based on the inspections, if it is determined that the electronic component 2 is non-defective, the fabrication process moves on to a step illustrated in FIG. 16. On the other hand, if it is determined that the electronic component 2 is defective, the defective electronic component 2 can easily be replaced with a new one since the defective electronic component 2 is in an unsupported state.

After it is determined that the electronic component 2 is non-defective, the deformation-restraining layer 11 on each of the connectors 3 and 7 is removed. This removal of the deformation-restraining layer 11 allows the top and lower surfaces of the arm portions 3b and 7b to be completely free of adjacent layers. Consequently, the internal stress induces elastic deformation of the arm portions 3b and 7b, whereby the arm portions 3b and 7b curl even further. Referring to FIG. 16, each of the terminals 5 is thus gripped between the corresponding arm portions 3b and 7b of the connectors 3 and 7.

If the deformation-restraining layers 11 are resist layers, the deformation-restraining layers 11 can be removed by using, for example, a resist-removing solution. Alternatively, the deformation-restraining layer 11 may be removed by other processes.

In the present invention, it is preferable to perform a heat treatment during the unsupported state in FIG. 15. By performing the heat treatment, the deformation-restraining layer 11 can be removed, and moreover, the internal stress contained in the arm portions 3b and 7b may increase such that the arm portions 3b and 7b can be easily deformed to form a sharper curve, as shown in FIG. 16. Accordingly, each terminal 5 can be gripped between the arm portions 3b and 7b more firmly.

If there is a significant difference in thermal expansion coefficients between the substrate 1 and the electronic component 2, the heat treatment can cause a large distortion between the two. However, due to the resiliency of the arm portions 3b and 7b and the holding portions 3c and 7c, the distortion can be compensated for by these portions 3b, 7b, 3c, and 7c. This prevents the electronic component 2 from being dislocated from the substrate 1 and thus allows the electronic component 2 to be firmly fixed to the substrate 1.

The present invention is characterized in that: different types of internal stress are added to the lower surface of each connector 3 (connector 7) and the upper surface of each connector 3 (connector 7) in the step shown in FIG. 8: the deformation-restraining layer 11 is formed on each connector 3 (connector 7) in the step shown in FIGS. 12A and 12B; the dummy layer 4 below the arm portion 3b of each connector 3 (connector 7) is removed in the step shown in FIG. 13; and the deformation-restraining layer 11 on each connector 3 (connector 7) is removed and the internal stress forces the arm portions 3b and 7b to curl upward in the step shown in FIG. 16, so that the electronic component 2 can be gripped by the arm portions 3b and 7b.

According to the fabrication method described above, the electronic component 2 is firmly gripped by the arm portions 3b and 7b of the connectors 3 and 7, thus achieving a compact connection unit.

The present invention is further characterized in that an inspection for the electrical properties of the electronic component 2 can be performed during the fabrication process and the electronic component 2 is fixed to the substrate 1 after the inspection. Specifically, before the electronic component 2 is fixed to the substrate 1 in the step shown in FIG. 16, the inspection is performed in the unsupported state, that is, a state in which the electronic component 2 is merely disposed on the connectors 3 and 7. For this reason, even if it is determined that the electronic component 2 is defective, the defective electronic component 2 can easily be replaced with a new one. This achieves an easier inspection process for the electrical properties of the electronic component 2. On the other hand, if it is determined that the electronic component 2 is non-defective, the electronic component 2 can be instantly fixed to the substrate 1, thus improving the productivity rate.

For the supporting means between the electronic component 2 and the substrate 1, the means illustrated in FIGS. 1 to 4 may be applied, which includes the connectors 3 and 7 for gripping the electronic component 2 and for connecting the electronic component 2 to the substrate 1. Moreover, as shown in FIG. 5, an alternative supporting means is also possible, which includes only a single connector 3. In this case, as described previously, the arm portion 3b of the connector 3 resiliently urges against the second end portion of the electronic component 2 so that the first end portion of the electronic component 2 is pressed against, for example, the wall 11a. This allows the electronic component 2 to be firmly fixed to the substrate 1.

Although the fabrication method for the connection unit between the electronic component 2 and the substrate 1 is described above, the present invention can also be applied to fabrication methods for connection units between other components, such as micro-components, and substrates.

What is claimed is:

1. A connection unit for mounting a component to a substrate, the connection unit comprising:
   at least one connector disposed between the component and the substrate and having a first end and a second end, said at least one connector having a mounting portion mounted on the substrate and having an arm portion at a side adjacent to the first end of said at least one connector, the arm portion being adjacent to the mounting portion and extending towards the component from the mounting portion, the arm portion urging against the component by internal stress,
   wherein the arm portion is connected to a predetermined position of the component and functions as a support between the component and the substrate.

2. The connection unit according to claim 1, wherein said at least one connector comprises at least two connectors between the substrate and the component, the component being gripped between the arm portions of said at least two connectors.

3. The connection unit according to claim 1, wherein the component is an electronic component and said at least one connector is electrically conductive,
   wherein the substrate is provided with wiring, and
   wherein the electronic component is electrically connected to the wiring via said at least one connector.

4. The connection unit according to claim 3, wherein the electronic component includes a terminal extending towards the substrate, and
   wherein the arm portion is connected to a predetermined position of the terminal.

5. The connection unit according to claim 3, wherein said at least one connector further has a holding portion at a side adjacent to the second end of said at least one connector, the second end being opposite to the first end of said at least one connector, the holding portion having internal stress, and
   wherein the internal stress forces a tip of the holding portion to bend upward toward a bottom surface of the component, the component being disposed on the tip of the holding portion, the tip functioning as a contact.

6. A method of fabricating a connection unit between a component and a substrate for mounting the component to the substrate, the method comprising:
   a first step for forming a dummy layer on the substrate and then forming at least one connector on the dummy layer, a first surface and a second surface of said at least one connector being provided with different types of internal stress;
   a second step for patterning said at least one connector into a predetermined shape, the patterned connector being provided with a mounting portion for mounting the connector to the substrate; an arm portion extending from a first side of the mounting portion; and a holding portion extending from a second side of the mounting portion;
   a third step for forming a deformation-restraining layer on said at least one connector, the deformation-restraining layer not being formed on the holding portion and over a part of the arm portion;
   a fourth step for removing at least a segment of the dummy layer disposed below the arm portion;
   a fifth step for disposing the component on the holding portion of said at least one connector; and
   a sixth step for removing the deformation-restraining layer so that the internal stress of the arm portion of said at least one connector forces the arm portion to bend toward the component, the arm portion being connected to a predetermined position of the component to function as a support between the component and the substrate.

7. The method according to claim 6, wherein said at least one connector comprises at least two connectors between the substrate and the component, and
   wherein the arm portions of said at least two connectors grip the component in the sixth step.

8. The method according to claim 6, wherein the component is an electronic component and said at least one connector is formed of a conductive material, and
   wherein the electric component is electrically connected to wiring provided in the substrate via said at least one connector.

9. The method according to claim 8, wherein the fifth step comprises an inspection substep for inspecting electrical properties of the electronic component after the electronic component is disposed on said at least one connector, the inspection substep being performed for determining whether the electronic component is defective or non-defective,
   wherein the fabrication process moves on to the sixth step if the electronic component is determined non-defective, and
   wherein, if the electronic component is determined defective, the defective electronic component is replaced with a new electronic component and the inspection substep is repeated for the new electronic component.

10. The method according to claim 9, wherein the second step comprises a substep for forming a plurality of holes in the arm portion of said at least one connector,
    wherein, in the third step, the deformation-restraining layer is not formed over a part of the arm portion provided with the holes, and
    wherein, in the fourth step, the segment of the dummy layer below the arm portion is removed by using the holes.

11. The connection unit according to claim 4, wherein said at least one connector further has a holding portion at a side adjacent to the second end of said at least one connector, the second end being opposite to the first end of said at least one connector, the holding portion having internal stress, and
    wherein the internal stress forces a tip of the holding portion to bend upward toward a bottom surface of the component, the component being disposed on the tip of the holding portion, the tip functioning as a contact.

* * * * *